United States Patent [19]

Oh

[11] Patent Number: 5,255,231
[45] Date of Patent: Oct. 19, 1993

[54] ARCHITECTURE OF REALIZING BALANCE OF BIT LINE SENSE AMPLIFIER IN DRAM CELL ARRAY

[75] Inventor: Jong H. Oh, Kyoungkido, Rep. of Korea

[73] Assignee: Hyundai Electronics Industries Co., Ltd., Ichonkun Kyoungkido, Rep. of Korea

[21] Appl. No.: 654,245

[22] Filed: Feb. 12, 1991

[30] Foreign Application Priority Data

Feb. 24, 1990 [KR] Rep. of Korea ............... 1990-2377

[51] Int. Cl.⁵ ............................................. G11C 11/40
[52] U.S. Cl. ................................ 365/202; 365/214
[58] Field of Search ............... 307/201, 530; 365/149, 365/189.01, 202, 190, 214

[56] References Cited

U.S. PATENT DOCUMENTS 3,942,164  3/1976  Dunn .................................. 365/214
4,916,661  4/1990  Nawaki et al. ................. 365/202 X Primary Examiner—Steven Mottola
Attorney, Agent, or Firm—Darby & Darby

[57] ABSTRACT

The present invention provides an architecture of a DRAM cell array having a plurality of bit lines and word lines. The word lines are formed by arranging metal word lines on poly-silicon word lines in parallel, and two bit lines construct a column. The metal word lines and the poly-silicon word lines are contacted to each other every predetermined column. The contacts form metal shunted areas of word lines in a high bit density semiconductor device. In the present invention, the two bit lines that are located in the vicinity of metal shunted area are conjoined together in order to construct a column, and the column is connected to a bit line sense amplifier.

3 Claims, 3 Drawing Sheets

ARCHITECTURE OF REALIZING BALANCE OF BIT LINE SENSE AMPLIFIER IN DRAM CELL ARRAY

BACKGROUND OF THE INVENTION

This invention generally relates to high-bit density dynamic random access memory devices (DRAMs) of the type which use word lines shunted by metal-wiring, and more specifically, to such DRAM devices which compensate for any imbalance of capacitance developed between the bit lines adjacent to the metal-wire shunting.

In the past years, the development of the DRAM device has steadily increased resulting in a similar increase in its bit density. Following current trends, the bit-density magnitude of the DRAM device increases by a factor of four every two to three years of development.

Such an increase in bit density has led to an increase in product applications for the DRAM, especially since the introduction of the 1 Megabyte DRAM chip.

The use of metal-wire shunting in DRAMs is known. DRAMs having word-lines shunted by metal wiring have proven to be effective in reducing the propagation delay time of a signal moving along the length of a word line. It is important to compensate for the increasing propagation delay time due to increasing bit density.

FIGS. 1 and 2 are conceptual schematics of a portion of the architecture PRIOR ART DRAM devices showing the intersection of polysilicon word-lines, bit-lines and a metal word-line shunt. The metal word lines are arranged in parallel over the polysilicon word lines. At predetermined intervals between bit-line columns, the metal word lines make contact with the polysilicon word lines, at metal shunting zones 11. Intersecting both metal and polysilicon word-lines are the bit lines which are paired off to define the bit-line columns. Located at one end of each bit-line pair is connected a bit-line sense amplifier 12.

A DRAM device may include a metal shunting zone 11 every 64 columns (bit-line pairs). The propagation delay time of the metal wire word lines can be ignored, in this case, because the resistance of the metal is about 0.001 the resistance of the polysilicon word lines. Therefore, the propagation delay time of the word lines of this DRAM depend on the resistance of the word-line driver and the propagation delay time of the polysilicon word lines between the metal shunt zones.

A characteristic delay time (TD) is expressed as the following formula:

$$TD = 1.02 \times Rwl \times Cwl + 2.21 \times Rd \times Cw$$

where,
Rwl = the resistance of entire word-lines;
Cwl = the capacitance of entire word-lines; and
Rd = the resistance of the word-line driver.

As previously discussed, metal-wire shunting of the word-lines in a DRAM device beneficially reduces the propagation delay time of the word-lines, but the use of metal-wire shunting also includes certain disadvantages. One such disadvantage is that the area of the DRAM chip is forced to increase due to the additional area needed to accommodate the contact points between the polysilicon and metal word-lines. Another disadvantage to the use of metal-wire shunting is that each metal shunting zone 11 adversely effects the operation of any adjacent bit-line sense amplifiers. Referring to PRIOR ART FIGS. 1 and 2, the bit-lines 1 and 2, which are adjacent to the metal shunting zone 11, will have a resulting capacitance different to the capacitance of the more remote bit-lines on the DRAM device. This difference in capacitance between the bit-lines resides in a coupling capacitance. Bit-lines positioned remote of the metal shunting zone 11 will include a coupling capacitance value of 2 Cc resulting from a coupling influence of left and right neighboring bit-lines. Whereas the bit-lines 1 and 2 which lie adjacent the metal shunting zone 11 have a coupling capacitance value of 1 Cc due to their single respective neighbor (i.e., bit-line has only a left neighbor and bit-line 2 has only a right one).

This imbalance of capacitance of bit-lines 1 and 2 prevents their connected sense amplifiers from operating as well as the other, more remote sensing amplifiers. Referring to PRIOR ART FIG. 3, the sensing amplifier 12 connected to bit-lines located adjacent to the metal shunting zone 11 experiences a capacitance imbalance as much as 1 Cc. Each pair of sensing amplifiers 12 adjacent each metal shunting zone 11 of the DRAM device will be effected and will not operate properly. The accumulated result will lower the operational characteristics of the entire DRAM itself.

This capacitance imbalance problem has been recognized by the prior art and one resulting solution is illustrated in PRIOR ART FIG. 4. Here, two dummy bit-lines 91 and 92 are supplied on either side of the metal shunting zone 11 and connected to a common ground. Each dummy bit-line 91, 92 did allow the nearest functional bit-line pair and the corresponding sense amplifier 12 to operate with a balanced coupling capacitance, however such dummy bit-lines required additional space which was not readily available on the DRAM chip. For example, if a pitch of a bit-line is represented by "Lb", then in order to accommodate the dummy bit-lines the chip area would have to increase as much as 2 Lb for every metal shunt zone used.

It is an object of the present invention to provide a high bit density DRAM device of the type including metal-wire shunting wherein bit-line pairs both remote from and adjacent to the metal shunt zones include balanced capacitive coupling without jeopardizing the overall bit density of the DRAM device.

SUMMARY OF THE INVENTION

A dynamic random access memory (DRAM) device of the type having a plurality of bit-line pairs, sense amplifiers, polysilicon word-lines and metal word-lines wherein each bit-line pair is connected to one of a plurality of sense amplifiers, and wherein said metal word-lines connect said polysilicon word-lines at predetermined metal-wire shunt zones. The two bit-lines most adjacent to each metal-wire shunt zone (the ones located on either side) make-up a first bit-line pair and are connected to a first sense amplifier. This arrangement of bit-lines about each metal-wire shunt zone provides a balanced coupling capacitance to each connected sense amplifier so that all sense amplifiers experience an equal and balanced coupling capacitance throughout the DRAM device.

DETAILED DESCRIPTION OF THE PREFERRED EMBODIMENT

Figure 5:
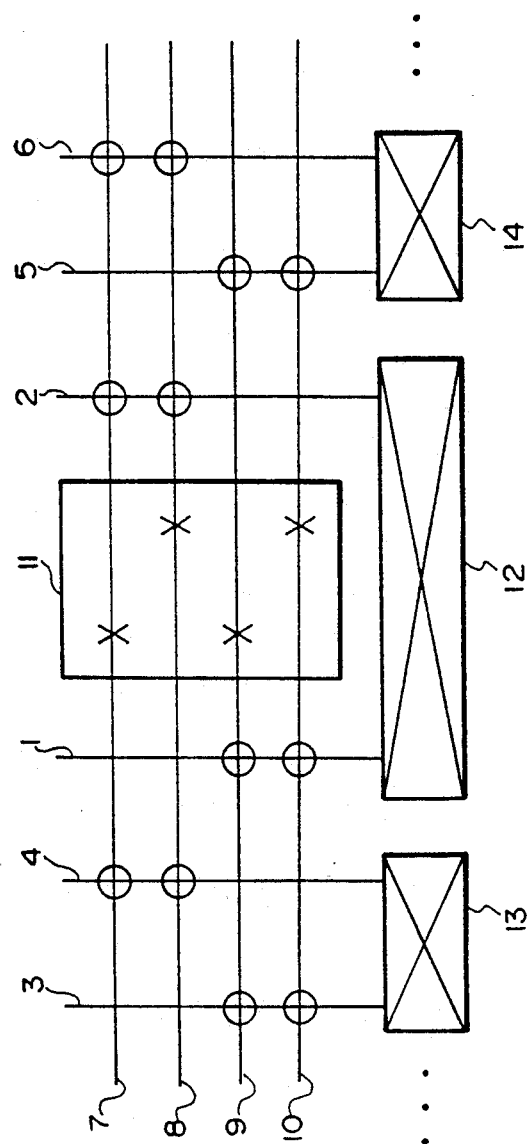
FIG. 5 is a plan view schematic of a portion of a DRAM device architecture showing the intersection of polysilicon word-lines, bit-lines and a metal word-line shunt in accordance with the present invention.
Figure 6:
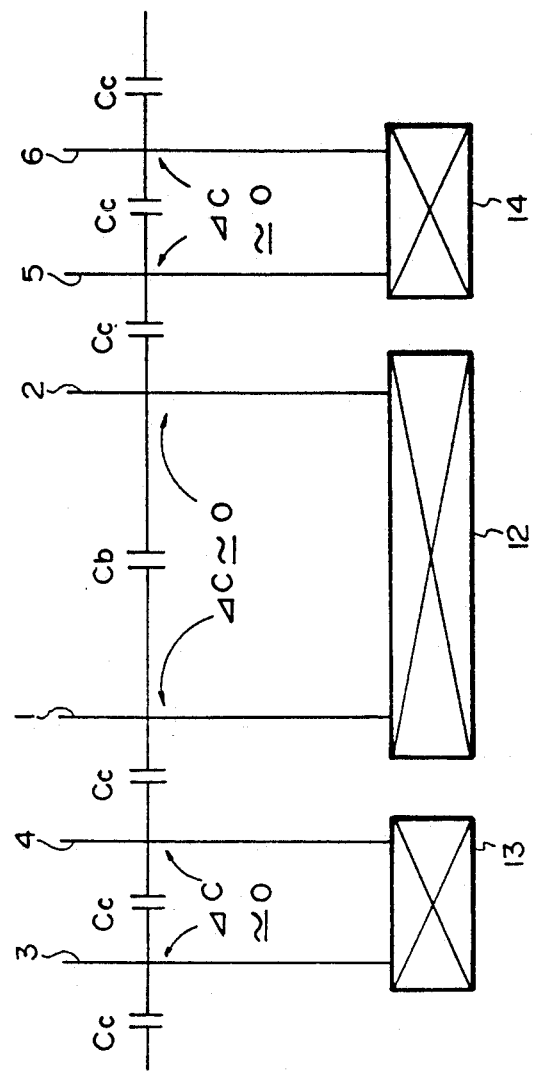
FIG. 6 is a plan view schematic of the DRAM device of FIG. 5 showing bit-line capacitive coupling in accordance with the present invention.

Referring to FIGS. 5 and 6, a schematic of the wiring architecture of a portion of a DRAM device is shown, in accordance with the present invention. FIG. 5 illustrates the interconnection of polysilicon word-lines 7 through 10, metal-wire shunt zones 11, and intersecting bit-lines 1 through 6 including sense amplifiers 12, 13 and 14, in accordance with the present invention. The symbol "∘" shown in FIG. 5 represents a memory cell, and the symbol "X" represents a contact point between a polysilicon word-line 7-10 and a metal word-line within the metal-wire shunt zone 11.

Figure 1:
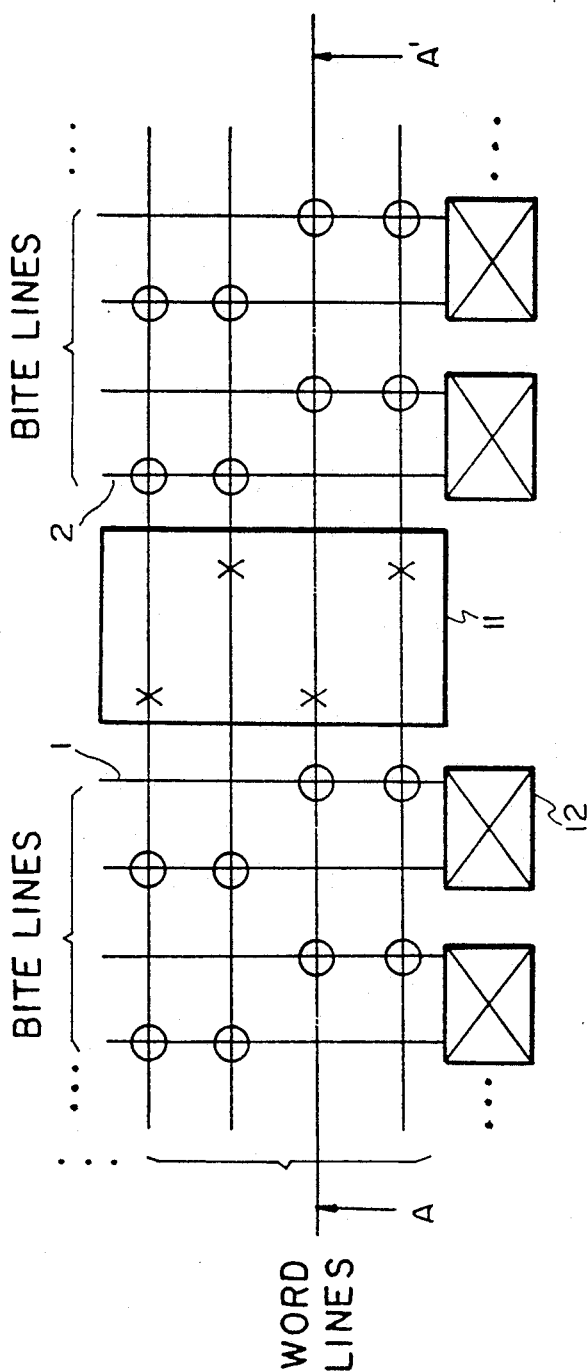
FIG. 1 is a plan view schematic portion of a portion of the architecture of a PRIOR ART DRAM device showing intersection of polysilicon word-lines, bit-lines and a metal word-line shunt.
Figure 2:
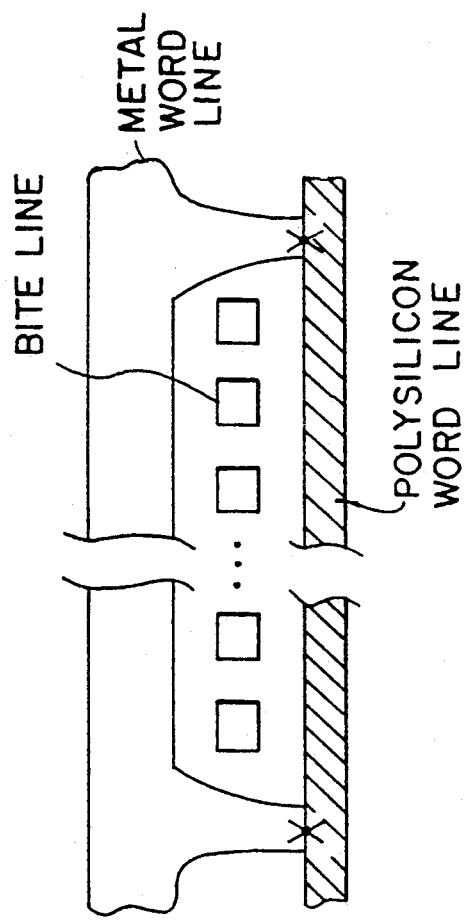
FIG. 2 is a conceptual side view of the architecture of the PRIOR ART DRAM device of FIG. 1, taken along the lines A—A.
Figure 3:
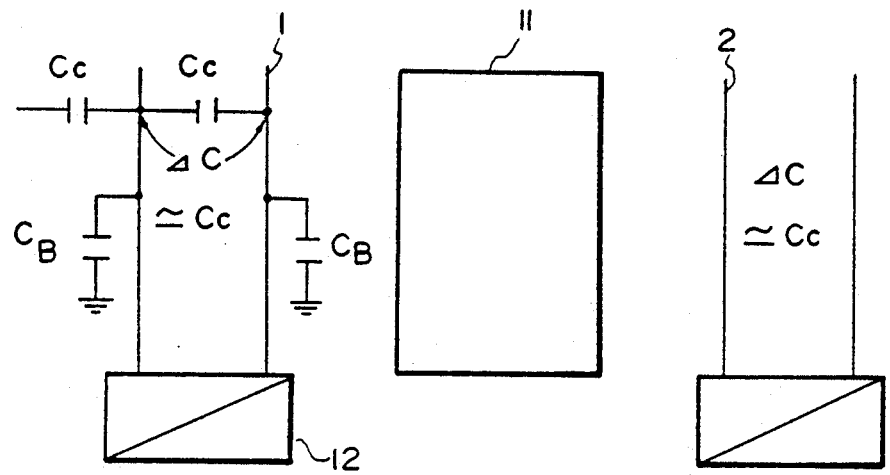
FIG. 3 is a conceptual plan view schematic of the PRIOR ART DRAM device shown in FIGS. 1-2, showing details of bit-line capacitive coupling of the PRIOR ART DRAM device.
Figure 4:
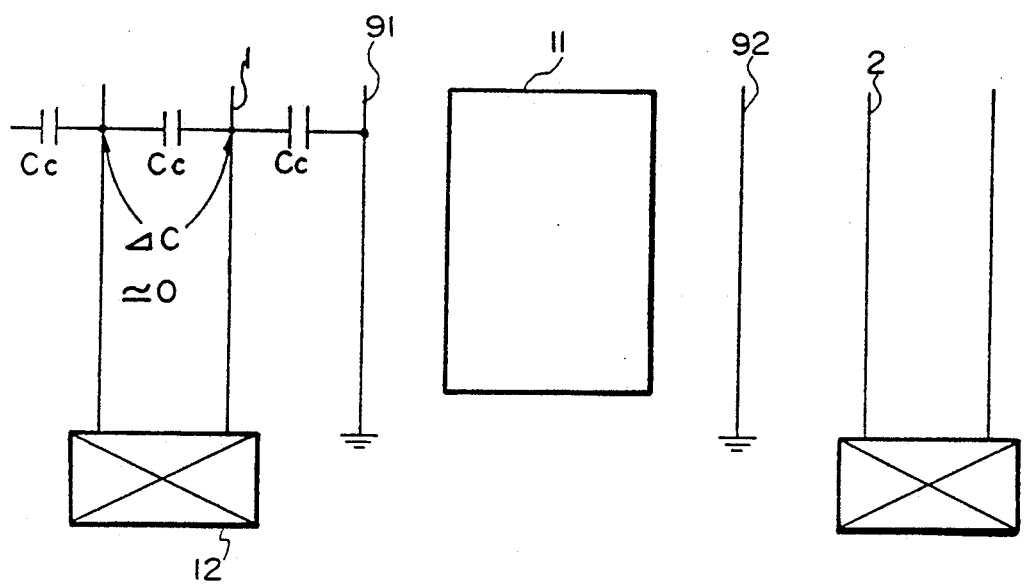
FIG. 4 is a conceptual plan view schematic of another PRIOR ART DRAM device showing dummy bit-lines.

As shown in FIG. 5, the particular bit-line column assignment (one column is two bit-lines) for each sense amplifier 12, 13 and 14 is changed from that of the prior art of FIGS. 1, 3, and 4. In accordance with the invention, bit-lines 1 and 2, which are on each side and immediately adjacent to the metal-wire shunt zone 11 are considered a bit-line pair and make up a bit-line column. A sense amplifier 12 is formed across the metal-wire shunt zone 11 to connect bit-lines 1 and 2 as a first bit-line column. On either side of the metal-wire shunt zone 11, the bit-lines 3 and 4, and bit-lines 5 and 6 are paired off as bit-line columns for sense amplifiers 13 and 14, respectively.

This bit-line column and sense amplifier arrangement compensates for the otherwise imbalanced coupling capacitance of the prior art systems. The sense amplifiers 12. 13, and 14 (and all others) are balanced in the arrangement shown in FIG. 5. Bit-line 1 has 1 Cc coupling capacitance which is matched with bit-line 2, also having 1 Cc coupling capacitance. The result is that each sense amplifier of the DRAM device has a balanced coupling capacitance from each bit-line pair. This is done so without increasing chip area or wasting valuable chip real estate.

Referring to FIG. 6, a schematic of the architecture of FIG. 5 is shown, including bit-lines 1 through 6, sense amplifiers 12, 13 and 14 and conceptual values of the coupling capacitance of each bit-line column 1 and 2, 3 and 4, and, 5 and 6. The schematic shows that all the sense amplifiers around the metal-wire shunt zone 11 have a balanced coupling capacitance. Bit-lines 1 and 2 have a coupling capacitance of as much as Cb+Cc wherein the difference of the coupling capacitance between bit-lines 1 and 2 is effectively zero Bit-lines 1 and 2 provide adjacent bit-lines 4 and 5, respectively, with a coupling capacitance of Cc. Therefore, bit-lines 3 and 4, and, 5 and 6 have a balanced coupling capacitance as much as Cc+Cc wherein, again, the difference of the coupling capacitance between each bit-line of each respective bit-line pair is effectively zero.

Through rearrangement of the sense amplifiers and bit-line columns the resulting DRAM device of the invention beneficially operates all bit-line columns under the same conditions, i.e., balanced coupling capacitance throughout. Due to the relocation of the sense amplifiers of the present invention, the resulting DRAM device will invariably out perform its prior art equivalents of equal chip area.

What is claimed is:

1. A semiconductor DRAM device of the type including a plurality of bit-line pairs, wherein each bit-line pair is connected to one of a plurality of sense amplifiers, said DRAM device also including a plurality of intersecting polysilicon word-lines and a plurality of metal word-lines wherein said metal word-lines connect said polysilicon word-lines at predetermined metal-wire shunt zones, each of said sensing amplifiers having a coupling capacitance value, said DRAM device comprising:

in a first of said bit-line paris, first and second bit-lines located on either side and adjacent to at least one of said predetermined metal-wire shunt zones;

a first of said plurality of sense amplifiers connected to said first and second bit-lines, so that said coupling capacitance value of said first sense amplifier is equal to and balanced with said coupling capacitance values of said other sensing amplifiers.

2. The semiconductor DRAM device according to claim 1, further comprising a second bit-line pair positioned adjacent to said first bit-line.

3. The semiconductor DRAM device according to claim 1, further comprising a third bit-line pair positioned adjacent to said second bit-line.

* * * * *